United States Patent [19]
Tanizaki et al.

[11] Patent Number: 6,055,206
[45] Date of Patent: Apr. 25, 2000

[54] SYNCHRONOUS SEMICONDUCTOR MEMORY DEVICE CAPABLE OF REDUCING POWER DISSIPATION BY SUPPRESSING LEAKAGE CURRENT DURING STAND-BY AND IN ACTIVE OPERATION

[75] Inventors: Hiroaki Tanizaki; Hideto Hidaka; Tsukasa Ooishi; Shigeki Tomishima, all of Hyogo, Japan

[73] Assignee: Mitsubishi Denki Kabushiki Kaisha, Tokyo, Japan

[21] Appl. No.: 09/274,623

[22] Filed: Mar. 23, 1999

[30] Foreign Application Priority Data

Oct. 5, 1998 [JP] Japan ................................ 10-282749

[51] Int. Cl.$^7$ ........................................ G11C 8/00
[52] U.S. Cl. ................ 365/230.06; 365/299; 365/230.03
[58] Field of Search ................. 365/230.06, 230.03, 365/229, 233

[56] References Cited

U.S. PATENT DOCUMENTS

| | | | |
|---|---|---|---|
| 5,384,740 | 1/1995 | Etoh et al. ........................ | 365/189.09 |
| 5,606,265 | 2/1997 | Sakata et al. ...................... | 326/34 |
| 5,640,359 | 6/1997 | Suzuki et al. ..................... | 365/230.06 |
| 5,875,149 | 2/1999 | Oh et al. ........................... | 365/230.06 |
| 5,959,927 | 9/1999 | Yamagata et al. ................. | 365/229 |

FOREIGN PATENT DOCUMENTS 6-203558 7/1994 Japan.
6-242847 9/1994 Japan.

OTHER PUBLICATIONS

"Ultra LSI Memory", K. Ito, pp. 356–366.
"Development of 18 Mbit Concurrent RDRAM", T. Ishikawa et al., NEC Giho, vol. 51, No. 3/1998, pp. 21–24.
"A 32–Bank 1 Gb Self–Strobing Synchronous DRAM with 1 GByte/s Bandwidth", J. Yoo et al., IEEE Journal of Solid–State Circuits, vol. 31, No. 11, Nov. 1996, pp. 1635–1643.

*Primary Examiner*—Tan T. Nguyen
*Attorney, Agent, or Firm*—McDermott, Will & Emery

[57] ABSTRACT

In a synchronous semiconductor memory device of the present invention, a main word driver and a sub decode driver have a function to take in a row decode signal in response to activation of a bank and to maintain the state of the row decode signal. Accordingly, of the circuits associated with row selection, a row pre-decoder, a row decoder and a row system control circuit can operate under a hierarchical power supply structure.

20 Claims, 9 Drawing Sheets

SYNCHRONOUS SEMICONDUCTOR MEMORY DEVICE CAPABLE OF REDUCING POWER DISSIPATION BY SUPPRESSING LEAKAGE CURRENT DURING STAND-BY AND IN ACTIVE OPERATION

BACKGROUND OF THE INVENTION

1. Field of the Invention

The present invention relates to a semiconductor memory device, and, more particularly, to a semiconductor memory device operating in synchronization with an external clock signal.

2. Description of the Background Art

With development of memories with larger storage capacities in recent years, further miniaturization of transistors has been proceeded. As the size of a transistor decreases, it becomes inevitable to lower an operating power supply voltage (hereinafter, simply referred to as an "operating voltage") to ensure reliability of the operation of the transistor.

In order for an MOS transistor to operate with such low operating voltage without damaging its operating speed, it is necessary to lower the threshold voltage of the transistor. However, such reduction in the threshold voltage causes inadequate cutoff of the transistor at the time of shutdown, thereby leading to generation of a leakage current due to a sub-threshold current. Low-power characteristic that is one of the most significant features of the CMOS circuits is thus lost.

Figure 13A:
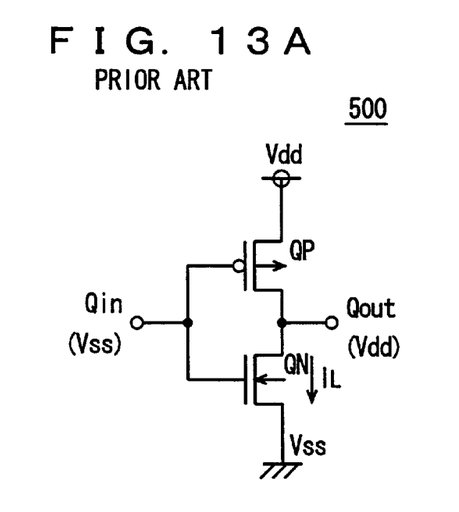
FIG. 13A is a circuit diagram of a normal inverter circuit 500.
Figure 13B:
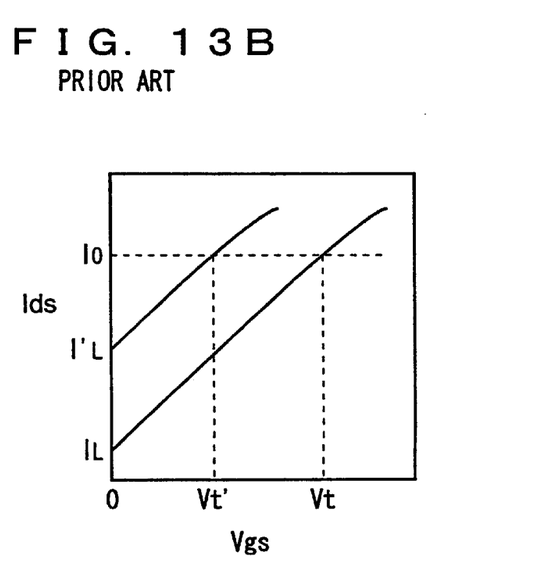
FIG. 13B is a key map illustrating a relation between decrease in the threshold voltage and increase in the sub-threshold current in inverter circuit 500.

FIG. 13A shows a circuit configuration of a CMOS inverter circuit 500, and FIG. 13B shows a relation between the threshold voltage and the sub-threshold voltage in inverter circuit 500.

Referring to FIG. 13A, inverter circuit 500 includes a p channel transistor QP and an n channel transistor QN which are serially connected to each other between an operating voltage Vdd line and a ground voltage Vss line, and which have gates receiving an input signal Qin, respectively. These transistors QP and QN connected to each other have drains connected to each other, which becomes an output node.

Generally, the operating speed of a transistor is almost inversely proportional to the difference between the operating voltage Vdd and the threshold voltage Vt, i.e., Vdd−Vt. Therefore, Vt must be lowered in response to reduction of Vdd to ensure a sufficient operating speed of transistor. Specifically, in FIG. 13A, when input signal Qin is at Vss (an "L" level), p channel transistor QP is turned ON and n channel transistor QN is turned OFF. However, if threshold voltage Vt of n channel transistor QN is low, a sub-threshold current IL flows through transistor QN. Similarly, when input signal Qin is at Vdd (an "H" level), the sub-threshold current flows through p channel transistor QP.

Referring to FIG. 13B, the threshold voltage is defined by a gate-to-source voltage of the case where a source/drain current Ids attains a prescribed value Io. If the threshold voltage is at Vt, the source/drain current or the sub-threshold current when the gate-to-source Vgs=0V is at IL; if the threshold voltage is lowered to Vt', the sub-threshold current when Vgs=0V rises to IL'.

As explained above, by the reduction of the operating voltage of transistor in accordance with the integration to higher density, the sub-threshold current increases to a value that cannot be neglected. Further, this sub-threshold current is proportional to the transistor size (W/L, W: channel width, L: channel length). Total W/L of transistors in the entire chip increases according to the higher degree of integration of transistors, which, accompanied by the reduction of the operating voltage, further increases the leakage current generated in the entire memory.

An exemplary technique for decreasing this sub-threshold current is described in *Ultra LSI Memory* (written by Kiyoo Ito, Baifukan), pp. 356–366, for example.

Figure 14:
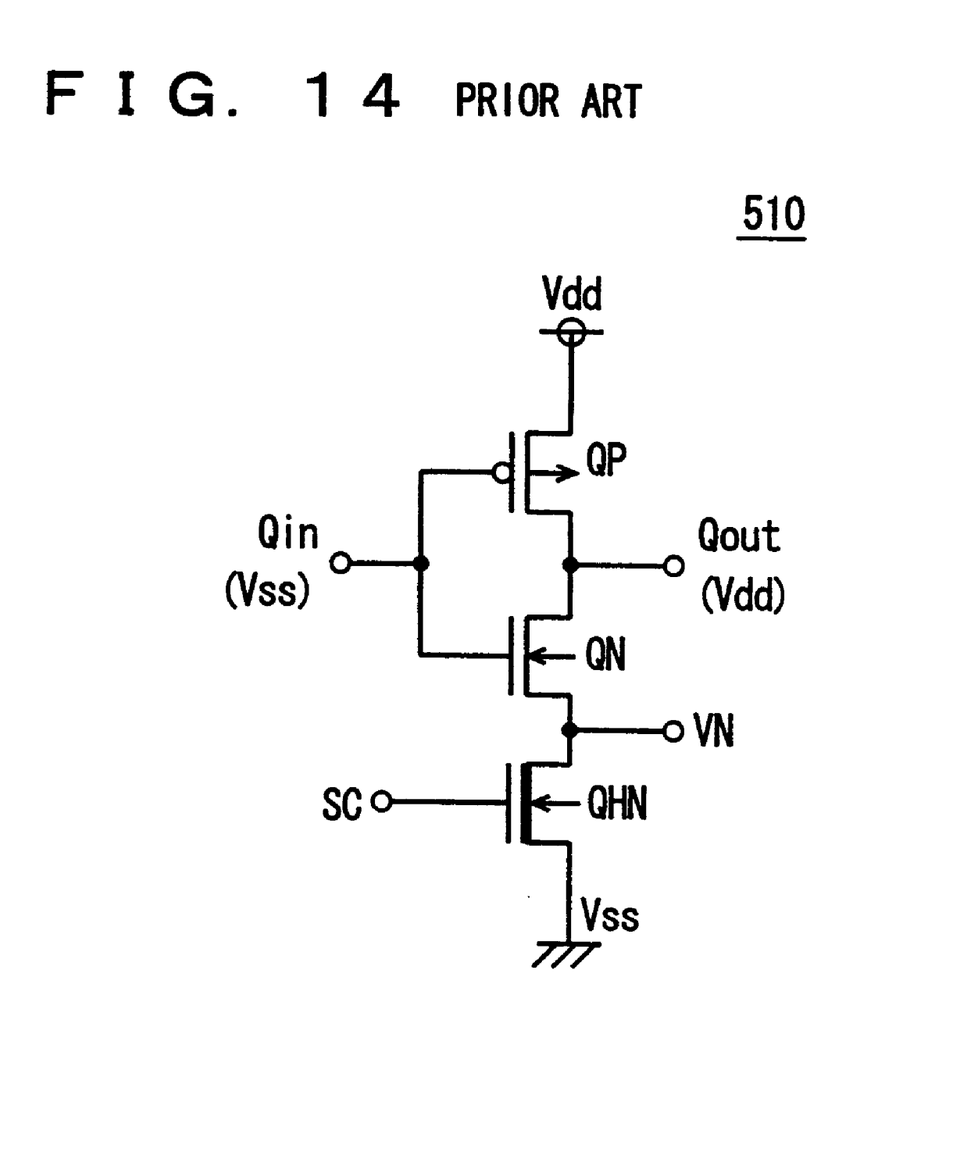
FIG. 14 is a circuit diagram of an inverter circuit which is directed for reduction of the sub-threshold current by switching a source voltage.

FIG. 14 is a circuit diagram of an inverter circuit 500, shown in the above reference, for reducing the sub-threshold current by switching a source voltage.

Referring to FIG. 14, compared to inverter circuit 500 in FIG. 13A, inverter circuit 510 further includes an n channel transistor QHN between n channel transistor QN and the ground power supply voltage Vss line. N channel transistor QHN is a transistor having a threshold voltage Vvn that is higher than those of transistors QP and QN. Transistor QHN is controlled by a signal SC received at its gate. When transistor QHN is turned ON, a voltage VN or the source voltage of transistor QN becomes Vss, and normal logic operation is conducted. When transistor QHN is turned OFF, the source voltage of transistor QN is raised by Vvn. Thus, even when input signal Qin=Vss, the gate-to-source voltage Vgs of transistor QN becomes −Vvn and reverse-biased, and therefore, a sufficient OFF state can be ensured for transistor QN, and the sub-threshold current of transistor Qn can be reduced considerably.

If, instead of providing transistor QHN, a p channel transistor having a high threshold voltage is connected between transistor QP and the operating voltage Vdd line, the sub-threshold current flowing through transistor QP when input signal Qin=Vdd can be reduced to a large extent.

However, such reduction of the sub-threshold current by switching the source voltage as in inverter circuit 510 can only be successful in the case where input signal Qin has a constant value. The same effect that the sub-threshold current is reduced cannot be obtained when Qin is a random input.

In a semiconductor memory device, normally a large number of transistors, e.g., word drivers, are used in the circuits that are associated with row selection. Especially in a dynamic random access memory (hereinafter, referred to as "DRAM"), refresh operation must be conducted periodically, which operation needs dynamic row selection. Therefore, it is difficult simply to apply thereto the above-described method of reducing the sub-threshold current.

Further, with the improvement of the operating speed of a microprocessor in recent years, there has been a need to realize high-speed access of DRAM or the like employed as a main memory device. A DRAM of a synchronous type (synchronous DRAM: hereinafter, referred to as "SDRAM") has thus been used, which operates in synchronization with a clock signal.

Internal operations of such SDRAM are divided into operation in the row system and that in the column system and are controlled separately. Generally in SDRAM, a bank configuration has been employed for permitting still higher-speed operation, in which configuration a memory cell array is divided into a plurality of banks that can operate independent of one another. That is, the operation is controlled for each bank, separately for its row system operation and its column system operation.

In this type of SDRAM with such multiple bank configuration, configuration of the control circuit becomes complex, and thus, the number of circuits in the entire chip further increases. Therefore, the leakage current, or the above-described sub-threshold current, tends to increase during stand-by and in an active operation. Such increase of the leakage current is a fatal problem when the SDRAM is employed in a portable device which is battery driven, for example. Reduction of the leakage current thus becomes an essential issue.

SUMMARY OF THE INVENTION

An object of the present invention is to provide a synchronous semiconductor memory device with an increased storage capacity, which realizes low power dissipation by suppressing a leakage current during stand-by and in the active operation.

Another object of the present invention is to provide a synchronous semiconductor memory device with a large storage capacity, in which the control circuit is efficiently configured to occupy a small space of the entire chip area.

According to one aspect of the present invention, a synchronous semiconductor memory device receiving an address signal and a control signal in synchronization with an external clock signal and sending and receiving storage data includes:

a memory cell array, word lines, a control circuit, and row select circuits.

The memory cell array has a plurality of memory cells arranged in rows and columns, and is divided into a plurality of memory cell blocks.

The word lines are provided corresponding to respective rows of the memory cells.

The control circuit instructs at least one of the plurality of memory cell blocks to perform a prescribed operation selectively in response to the address signal and the control signal.

A row select circuit is provided for a corresponding one of said memory cell blocks, and selects a row of the memory cell block in response to the address signal. The row select circuit includes a row select signal generating circuit, hierarchical power supply circuit, row select signal lines, and row drive circuits.

The row select signal generating circuit generates pulse-wise row select signals according to the address signal.

The hierarchical power supply circuit is activated in response to the selection of the corresponding memory cell block and supplies voltage power to the row select signal generating circuit at least during an active period of the pulse-wise row select signals, and changes voltage power level to reduce a leakage current through the row select signal generating circuit during a stand-by state.

A row select signal line transmits the pulse-wise row select signal to the corresponding memory cell block.

A row drive circuit is coupled to one of the row select signal lines in response to the selection of the memory cell block for latching a state of the pulse-wise row select signal, and drives the potential level of a corresponding one of the word lines.

According to another aspect of the present invention, the synchronous semiconductor memory device receiving an address signal and a control signal in synchronization with an external clock signal and sending and receiving storage data includes:

a memory cell array, word lines, a control circuit, and row select circuits.

The memory cell array has a plurality of memory cells arranged in rows and columns, and is divided into a first plurality of memory cell blocks.

The word lines are provided corresponding to respective rows of the memory cells.

The control circuit instructs at least one of the plurality of memory cell blocks to perform a prescribed operation selectively in response to the address signal and the control signal.

A row select circuit is provided for every second plurality of memory cell blocks, and selects a row of the memory cell block in response to the address signal. The row select circuit includes a row select signal generating circuit, hierarchical power supply circuit, row select signal lines, and row drive circuits.

The row select signal generating circuit generates pulse-wise row select signals according to the address signal.

The hierarchical power supply circuit is activated in response to the selection of the memory cell block out of corresponding second plurality of memory cell blocks and supplies voltage power to the row select signal generating circuit at least during an active period of the pulse-wise row select signals, and changes voltage power level to reduce a leakage current through the row select signal generating circuit during a stand-by state.

A row select signal line transmits the pulse-wise row select signal to the corresponding second plurality of memory cell blocks.

A row drive circuit is coupled to one of the row select signal lines in response to the selection of the memory cell block for latching a state of the pulse-wise row select signal, and drives the potential level of a corresponding one of the word lines.

Accordingly, a primary advantage of the present invention is that the row select circuit of the synchronous semiconductor memory device can be made to operate under the hierarchical power supply circuit. Consequently, low-power operation by reducing the leakage current can be realized.

Further, the row select circuit of the synchronous semiconductor memory device not only can be made to operate with the hierarchical power supply circuit, but also can be provided commonly for a plurality of banks. Accordingly, in addition to the realization of the low-power operation by reducing the leakage current, layout efficiency can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
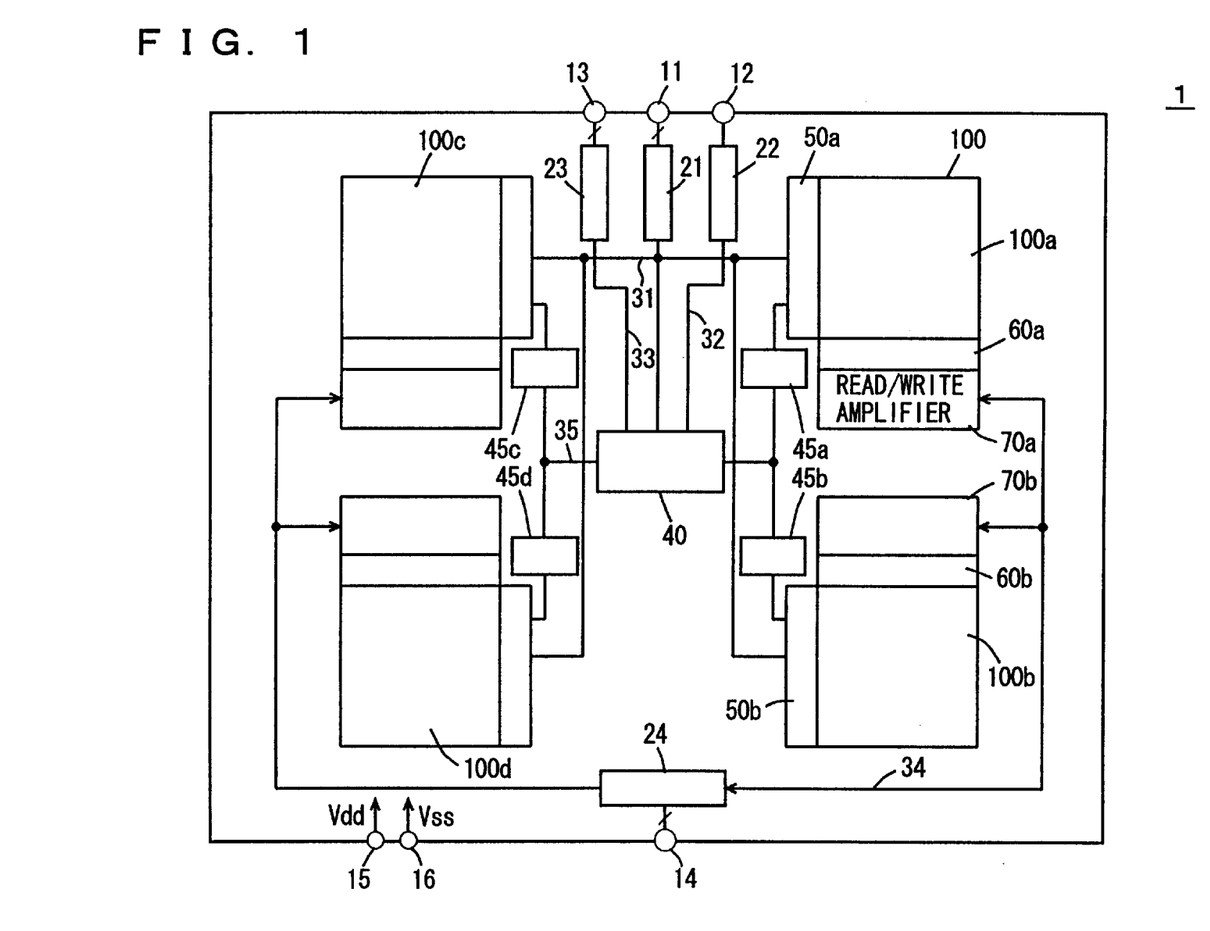
FIG. 1 is a schematic block diagram showing the entire configuration of the SDRAM 1 according to a first embodiment of the present invention.

FIG. 1 is a schematic block diagram showing the configuration of a SDRAM 1 according to the first embodiment of the present invention.

Referring to FIG. 1, SDRAM 1 includes: a control circuit 40 which receives and decodes external control signals /RAS, /CAS, /W, /CS and the like provided from an external control signal input terminal 12 via a control signal buffer 22 as well as a clock signal CLK and the like provided from a clock signal input terminal 13 via a clock buffer 23, to generate an internal control signal; a control signal bus 35 which transmits the internal control signal output from control circuit 40; and a memory cell array 100 in which memory cells are arranged in rows and columns.

Memory cell array 100 is divided, for example, into four memory cell blocks 100a–100d. Each memory cell block is configured to be able to operate as an independent bank. Memory cell blocks 100a–100d correspond to banks #0–#3, respectively. Hereinafter, each memory cell block may also be simply referred to as a bank.

SDRAM 1 includes an address buffer 21 which receives external address signals A0–Ai (i is a natural number) via an address signal input terminal 11. External address signals A0–Ai are taken into SDRAM 1 in synchronization with clock signal CLK under the control of control circuit 40, and converted by address buffer 21 into an internal address signal ADD.

Internal address signal ADD includes a bank address, a row address, and a column address.

SDRAM 1 further includes, for each bank, a row system control circuit 45 which controls operation of the row system, a row decoder 50 which selects a corresponding row (word line) of the bank selected by the address signal, and a column decoder 60 which selects a corresponding column (bit line pair) of the bank selected by the address signal. Row system control circuit 45, row decoder 50 and column decoder 60 are provided with internal address signal ADD by address buffer 21 via an address bus 31.

SDRAM 1 further includes a data input/output terminal 14, an input/output buffer 24 provided corresponding to data input/output terminal 14, a data bus 34 which transmits data between input/output buffer 24 and respective banks, and a read/write amplifier 70 which is provided for a respective bank and sends and receives data between data bus 34 and a selected memory cell column.

SDRAM 1 is provided with an operating voltage Vdd from a Vdd terminal 15, and a ground voltage Vss from a Vss terminal 16.

Signal /RAS supplied from external control signal input terminal 12 is a row address strobe signal which causes SDRAM 1 to initiate an internal operation and determines a time period over which the internal operation is active. Row decoder 50 and other circuits related to the operation for selecting a row of memory cell array 100 attain an active state in response to the activation of signal /RAS.

Signal /CAS supplied to external control signal input terminal 12 is a column address strobe signal which causes the circuits for selecting a column in memory cell array 100 to attain an active state.

Signal /CS supplied to external control signal input terminal 12 is a chip select signal which indicates that this SDRAM 1 is to be selected. Signal /W is a signal which instructs SDRAM 1 to perform a write operation.

The operation for taking in signals /CS, /RAS, /CAS and /W is conducted in synchronization with clock signal CLK.

The operation for taking in the address signals supplied to address signal input terminal 11 and sending/receiving of data via data input/output terminal 14 are also conducted in synchronization with clock signal CLK.

SDRAM 1 according to the first embodiment is directed to reduce a sub-threshold current during stand-by and in the active operation, in the circuits that are associated with row selection in which a large number of transistors are to be used. By thus reducing a leakage current to a large extent, the synchronous semiconductor memory device aims to realize low-power operation under a low operating voltage.

Figure 2:
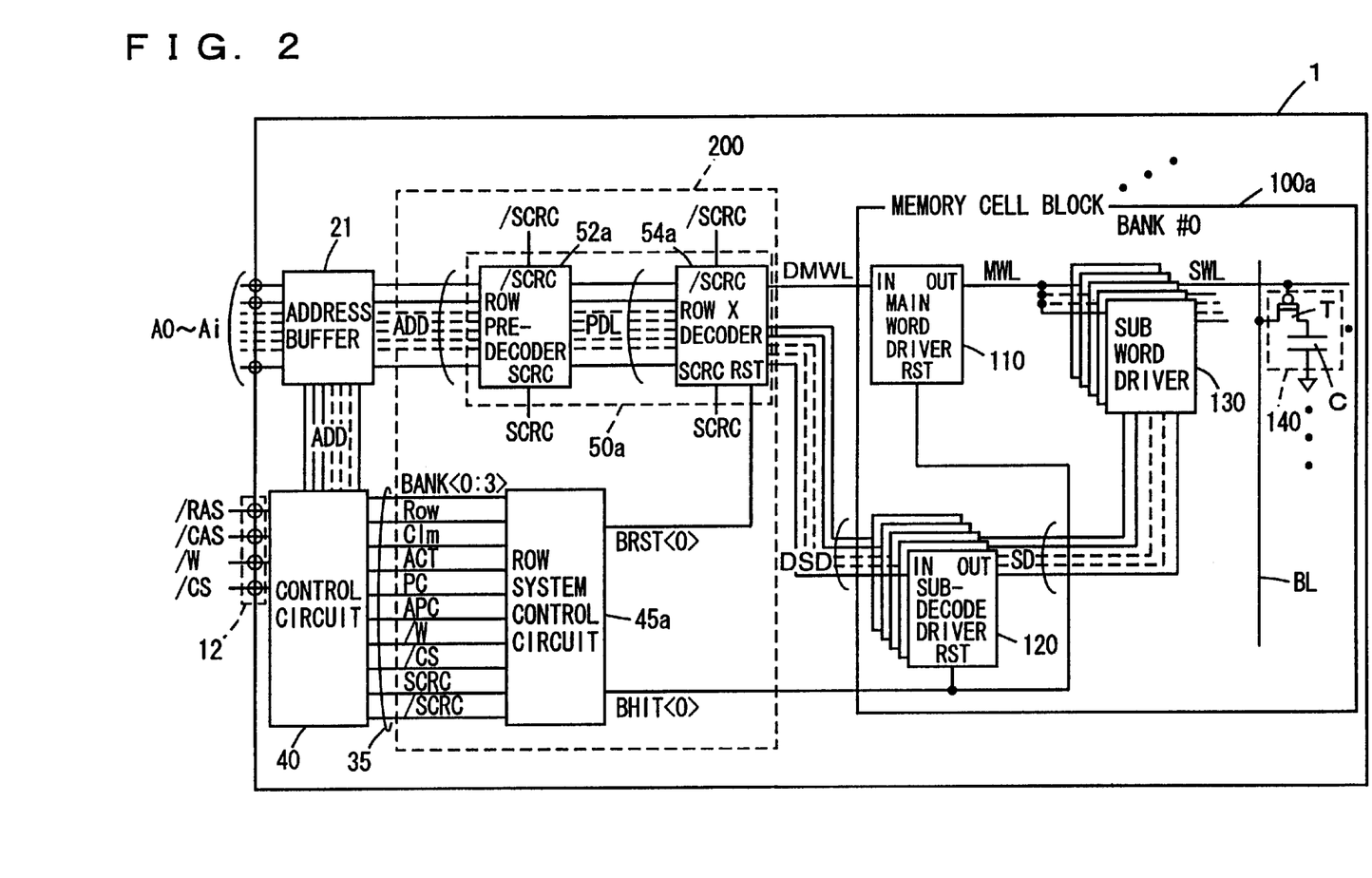
FIG. 2 is a block diagram showing the entire configuration of the circuits that are associated with row select operation in the SDRAM 1.

FIG. 2 is a schematic block diagram showing an entire configuration of the circuits that are related to row selection in the SDRAM 1 of the present invention.

Since the four banks shown in FIG. 1 each have a configuration identical to one another, the row select operation will be described in FIG. 2 with respect only to a representative bank #0, i.e., memory cell block.

With reference to FIG. 2, control circuit 40 receives external control signals /RAS, /CAS, /W and /CS, and generates the internal control signal. The internal control signal includes: bank address signals BANK<0> to BANK<3>, a row system access identification signal Row for designating activation of the row system circuit operation, a column system access identification signal Clm for designating activation of the column system operation, a bank activation signal ACT for designating activation of the bank, a pre-charge signal PC for designating the pre-charge operation of the selected bank from the control circuit, an all bank pre-charge signal APC for designating the pre-charge operation of all the banks, a write signal /W and a chip select signal /CS with respect to the bank, and a hierarchical power supply control signal SCRC and its inverted signal /SCRC.

The internal control signal is transmitted over control signal bus 35 to a row system control circuit 45a provided for bank #0. Based on the internal control signal, row system control circuit 45a generates a bank hit signal BHIT<0> for activating row system operation of bank #0 as well as a bank reset signal BRST<0> for resetting the row system operation of bank #0.

Address buffer 21 receives external address signals A0 to Ai and generates internal address signal ADD. Internal address signal ADD is transmitted over address bus 31 to control circuit 40 and to row decoder 50. A row decoder 50a selects a row of memory cells in bank #0.

A word line in each memory cell block in SDRAM 1 has a hierarchical structure with a main word line MWL and a sub word line SWL. That is, m sub word lines SWL are provided for one main word line MWL, and n main word lines MWL are provided in one bank. Row decoder 50a includes a row pre-decoder 52a and a row X decoder 54a.

Row pre-decoder 52a receives internal address signal ADD and generates a pre-decode signal PDL. Signal PDL includes pre-decode signals PM1 to PMn for selecting main word line MWL and pre-decode signals PS1 to PSm for selectively activating a sub-decode signal SD for correlating main word line MWL with sub word line SWL.

Row X decoder 54a has n main decoders for selectively activating main word line MWL and m sub decoders for selectively activating sub decode signal SD. The main decoder generates a signal DMWL for activating main word line MWL. Similarly, the sub decoder generates a signal DSD for activating sub decode signal SD.

Memory cell block 100a includes n main word drivers 110 each provided for a respective main word line MWL and m sub word drivers 120 each provided for a respective sub decode signal SD.

Memory cell block 100a further includes m×n sub word lines SWL. Sub word lines SWL are each provided for a respective row of memory cell block 100a. Sub word driver 130 drives sub word line SWL to a selected state when corresponding main word line MWL and sub decode signal SD are in an active state.

Memory cells 140 are disposed for respective sub word lines SWL. A memory cell 140 includes an access transistor T having a gate connected to sub word line SWL and a capacitor C for holding data. Access transistor T connects capacitor C and a bit line BL. When sub word line SWL is driven to a selected state, access transistor is turned ON, and thus the data held in capacitor C of memory cell included in the corresponding row are read out on bit line BL.

In semiconductor memory device 1, a region 200 surrounded by a dotted line in FIG. 2 is a region controlled by a hierarchical power supply control signal SCRC. Region 200 includes a row pre-decoder 52a, a row X decoder 54a, and a row system control circuit 45a. Circuits not included in region 200 are those out of control of the hierarchical power supply control signal, which constantly operate with operating voltage Vdd and ground voltage Vss as its power supply voltage, whether in its active state or in its stand-by state.

In contrast, each circuit included in region 200 is controlled by the hierarchical power supply control signal. It operates, when signal SCRC is in an active state (at an "H" level), receiving operating voltage Vdd and ground voltage Vss. It can operate, when hierarchical power supply control signal SCRC is in an inactive state (at an "L" level), with a voltage lower than operating voltage Vdd and a voltage higher than ground voltage Vss as its power supply voltage, respectively.

Concept of Hierarchical Power Supply Structure

Now, a concept of the hierarchical power supply structure used for circuits in region 200 of FIG. 2 will be described.

Figure 3A:
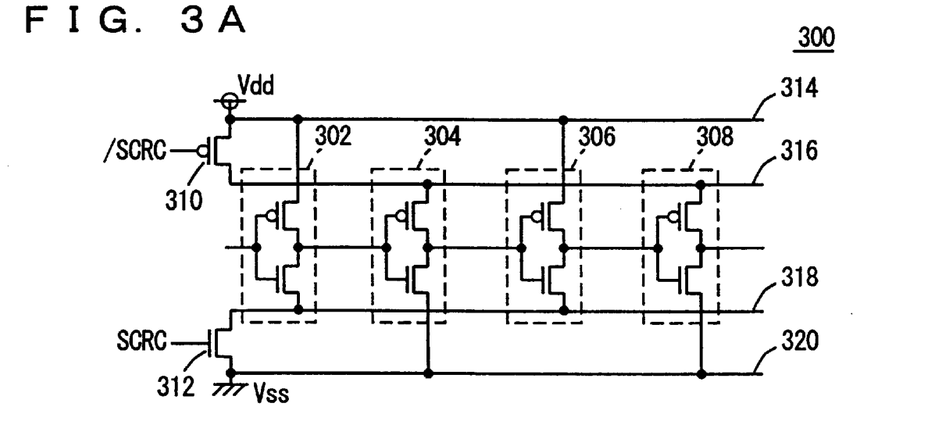
FIG. 3A is a circuit diagram showing the circuit configuration of a hierarchical power supply structure.
Figure 3B:
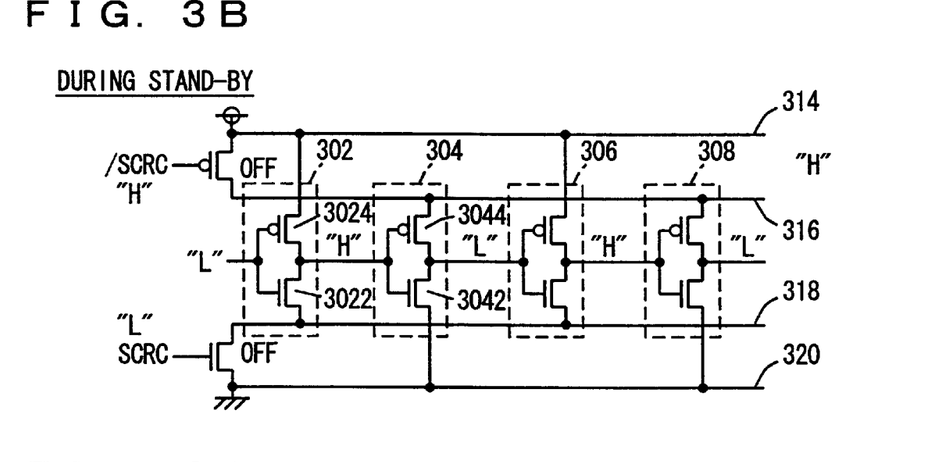
FIG. 3B is a circuit diagram illustrating a stand-by state of the hierarchical power supply structure.
Figure 3C:
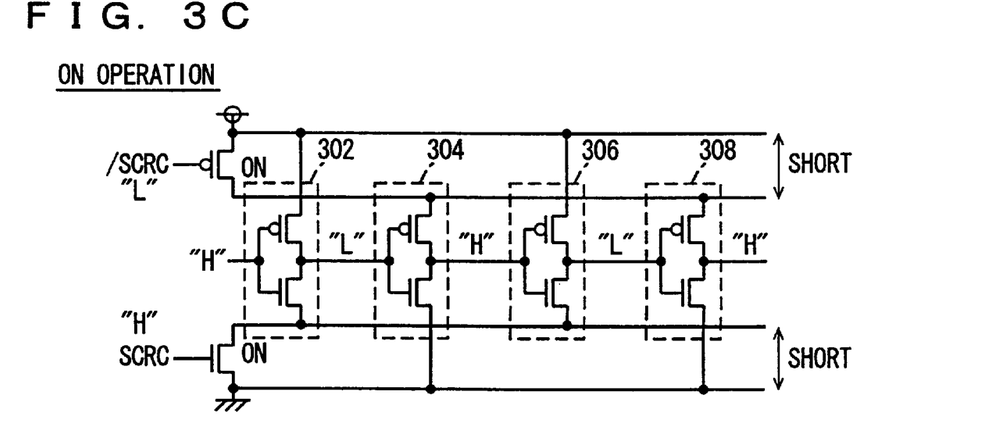
FIG. 3C is a circuit diagram illustrating an active state of the hierarchical power supply structure.

FIG. 3 is a diagram for use in illustration of the circuit configuration and the operation of the hierarchical power supply structure. FIG. 3A is a circuit diagram showing a configuration of a train of inverters driven by the hierarchical power supply structure. FIG. 3B shows the train of inverters of FIG. 3A during stand-by. FIG. 3C shows the train of inverters of FIG. 3A in an active state.

Referring first to FIG. 3A, inverters 302, 304, 306, and 308 are cascaded with one another. An interconnection line 314 transmits operating voltage Vdd, and an interconnection line 316 is connected to interconnection line 314 via a p channel MOS transistor 310. P channel MOS transistor 310 has a gate receiving a signal /SCRC that is an inverted signal of hierarchical power supply control signal SCRC.

An interconnection line 320 transmits ground voltage Vss. An interconnection line 318 is connected to interconnection line 320 via an n channel MOS transistor 312. N channel MOS transistor 312 has a gate receiving hierarchical power supply control signal SCRC.

Inverters 302 and 306 are provided with a power supply voltage from interconnection lines 314 and 318. Inverters 304 and 308 receive a power supply voltage from interconnection lines 316 and 320.

Referring now to FIG. 3B, during stand-by, signal SCRC is at an "L" level, and signal /SCRC is at an "H" level. Thus, p channel MOS transistor 310 and n channel MOS transistor 312 are both in an OFF state. In the low voltage operation, as described above, in the case where the threshold voltage has been lowered to permit a transistor to operate at high speed, a sub-threshold current in an unignorable quantity is produced as a leakage current even if transistors 310 and 312, and transistors included in inverters 302 to 308 are each in a cut-off state.

In FIG. 3B, suppose that the input level to inverter 302 is at an "L" level during stand-by, and in response, the input level of inverter 304 is at an "H" level, that of inverter 306 at an "L" level, and that of inverter 308 at an "H" level.

In this case, though n channel MOS transistor 312 is in an OFF state, a sub-threshold current exists, so that the voltage level of interconnection line 318 is at a voltage level that is higher than the voltage level of interconnection line 320, i.e., ground voltage Vss. Therefore, of the transistors constituting inverter 302, n channel MOS transistor 3022 has a gate of which a voltage level is at an "L" level. This means that the voltage level of its source is higher than voltage Vss. Consequently, n channel MOS transistor 3022 attains a stronger OFF state, and thus, the sub-threshold current flowing through inverter 302 reduces.

Similarly, though p channel MOS transistor 310 is in a cut-off state, the voltage level of interconnection line 316 is at a level lower than operating voltage Vdd due to its leakage current. In response, of the transistors constituting inverter 304, p channel MOS transistor 3044 has its source voltage that is at a voltage level lower than operating voltage Vdd, and has its gate voltage that is at the output level from inverter 302, i.e., at operating voltage Vdd. Accordingly, p channel MOS transistor 3044 attains a stronger OFF state, thus reducing the leakage current through inverter 304.

Likewise in inverters 306 and 308, the sub-threshold current decreases. Such hierarchical power supply structure thus allows suppression of leakage current in the train of inverters 302 to 308 on stand-by, which leads to reduction in current dissipation.

Referring to FIG. 3C, in the active operation, signal SCRC is at an "H" level, signal /SCRC is at an "L" level, and thus p channel MOS transistor 310 and n channel MOS transistor 312 are both in an ON state.

In response, inverters 302 to 308 each receive operating voltage Vdd and ground voltage Vss for operation.

Note that, in FIG. 3C, inverters 302 to 308 each operate with operating voltage Vdd and ground voltage Vss, so that a constant amount of leakage current is produced whether the input level of inverters are at an "H" level or at an "L" level.

The hierarchical power supply structure as described above can effectively reduce the leakage current, as shown in FIG. 3b, when the input level of a respective logic gate circuit (inverter in the case shown in FIG. 3b) is set at a fixed value during stand-by, by selectively causing either one of operating voltage Vdd and ground voltage Vss to have a hierarchical structure at a respective inverter dependent on input level thereof. Thus, when the input level of each logic gate included in a circuit is limited to either one on stand-by, a transistor equivalent to transistor 310 or 312 can be provided only for either one of operating voltage Vdd and ground voltage Vss, correspondingly. Accordingly, the above-described effects of the hierarchical power supply structure can be attained.

Further reduction of the leakage current is possible if a transistor having a threshold value that is higher than that of a respective transistor constituting inverters 302 to 306 is used as a respective transistor 310, 312.

It should be understood, however, in a logic gate circuit in which the state of the input signal on stand-by is not determined whether it is an "L" level or an "H" level, the above hierarchical power supply structure cannot operate effectively.

Returning back to FIG. 2, operation of SDRAM 1 will be considered. Of the circuits associated with row selection of SDRAM 1, address buffer 21 and control circuit 40 that are not included in region 200 as well as drivers 110 to 130 included in memory cell block 100a cannot utilize the hierarchical power supply structure, since the level of data they must deal with cannot be specified and will change due to their operating states.

As to the circuits included in region 200, i.e., row pre-decoder 52a, row X decoder 54a and row system control circuit 45a, these circuits can operate under the hierarchical power supply structure, since the state of each data is fixed and will not change at the time of normal stand-by when the bank is not activated. Thus, the leakage current due to the sub-threshold current of the MOS transistor can be reduced.

Furthermore, in SDRAM 1, main word driver 110 and sub-decode driver 120 included in memory cell block 100a are provided with a function to hold the state of data. Therefore, it is unnecessary to maintain at all the time the state of decode signals DMWL and DSD that are generated by row pre-decoder 52a and row X decoder 54a.

In other words, when performing read operation of data out of the memory cell (e.g., burst read), it is possible to reset the decode signals even in an active state, after a sufficient time period has passed for taking in external data. Row pre-decoder 52a and row X decoder 54a can thus utilize the hierarchical power supply structure. Similarly, row system control circuit 45a can operate under the hierarchical power supply structure, since the state of data being dealt will no longer change after a certain period of time.

As described above, in the configuration of SDRAM 1, the sub-threshold current can be reduced not only at the time when the chip is on stand-by. When performing an operation such as reading data of a memory cell, the circuits unnecessary for such operation can be configured to operate under the hierarchical power supply structure even when the chip is in an active state, after a sufficient time for taking in external data has been passed. Accordingly, the leakage current due to the sub-threshold current can be suppressed considerably, whereby low-power operation can be realized.

Detailed Configurations of Respective Circuits

Now, configuration of respective circuits shown in FIG. 2 will be described in detail.

Figure 4:
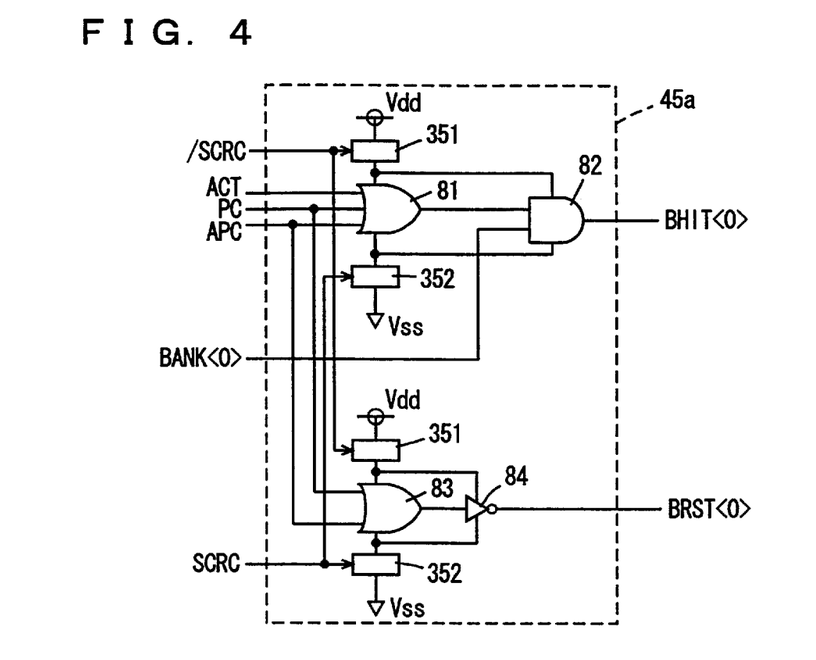
FIG. 4 is a circuit diagram showing a specific configuration of a row system control circuit 45.

FIG. 4 is a block diagram showing a specific configuration of row system control circuit 45a that is provided for bank #0.

Referring to FIG. 4, row system control circuit 45a includes: an OR gate 81 that receives a bank activation signal ACT, a pre-charge signal PC, and an all pre-charge signal APC to output a result of logical sum operation; and an AND gate 82 that inputs the output of OR gate 81 and a signal BANK<0> indicating that the bank #0 has been designated by the bank address. AND gate 82 outputs a bank hit signal BHIT<0>.

Row system control circuit 45 further includes: an OR gate 83 that receives pre-charge signal PC and all pre-charge signal APC as input signals; and an inverter 84 that inverts the output of OR gate 83. The output of inverter 84 is a bank reset signal BRST<0>.

Bank hit signal BHIT<0> is a signal that is activated (to an "H" level) when bank #0 is instructed to activate or conduct pre-charge operation. Bank reset signal BRST<0> is a signal that is activated (to an "L" level) when bank #0 is instructed to conduct pre-charge operation or all pre-charge operation.

Respective logic gates 81 to 84 included in the row system control circuit operate under the control of the hierarchical power supply structure. That is, logic gates 81 to 84 are provided with voltages by voltage switching circuits 351, 352 which transform operating voltage Vdd and ground voltage Vss depending on the hierarchical power supply control signals SCRC and /SCRC. Hierarchical power supply control signal SCRC is a signal that is inactivated (to an "L" level) during the above-described time periods, i.e., during stand-by, and a remaining time period in the active operation after a prescribed time has passed. When hierarchical power supply control signal SCRC is in an active state, voltage switching circuits 351 and 352 give operating voltage Vdd and ground voltage Vss as they are to logic gates 81 to 84. When hierarchical power supply control signal SCRC is in an inactive state, voltage switching circuits 351 and 352 provide logic gates 81 to 84 with a voltage that is lower than operating voltage Vdd and a voltage that is higher than ground voltage Vss. Though logic gates 81 to 84 in FIG. 4 are provided with the power supply voltage by a plurality of voltage switching circuits, a voltage switching circuit may of course be provided commonly for logic gates 81 to 84.

As explained above, row X decoder 54 includes a main decoder that generates a decode signal DMWL for driving main word line MWL to a selected state, and a sub decoder that generates a decode signal DSD for selecting a sub decode signal SD.

Figure 5:
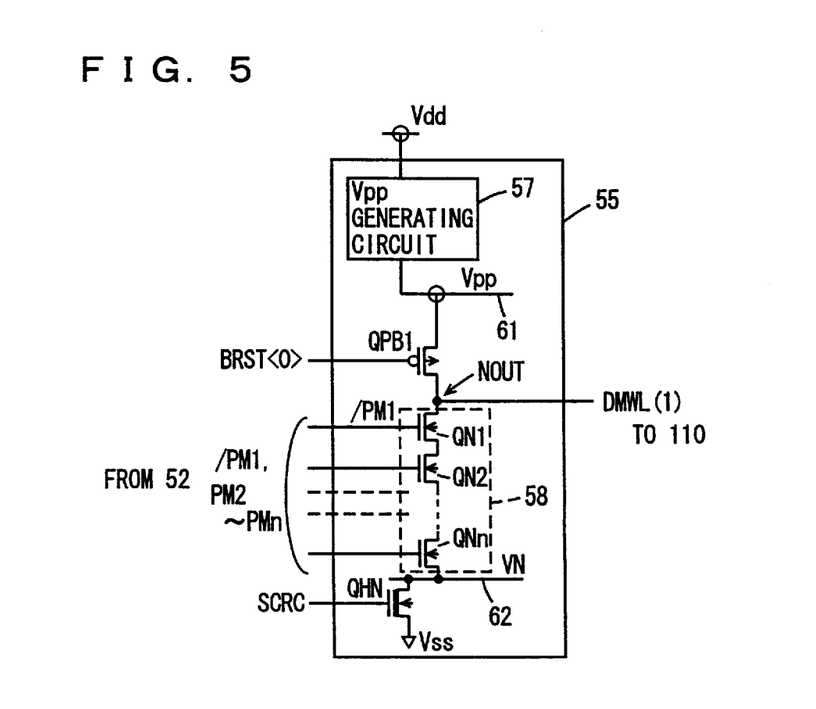
FIG. 5 is a circuit diagram showing a specific configuration of a main decoder 55 in a row X decoder 54.

FIG. 5 is a circuit diagram showing a specific configuration of main decoder 55.

Main decoder 55 is provided for a respective main word line MWL. Decode signal DMWL corresponds to a respective main word line MWL. FIG. 5 shows a main decoder that generates decode signal DMWL (1) corresponding to a first main word line MWL #1.

Main decoder 55 includes: a Vpp generating circuit 57 that receives operating voltage Vdd and transforms the same to a voltage Vpp which is suitable for drive of the word driver; an output node that outputs decode signal DMWL(1); and a p channel transistor QPB1 connected between an interconnection line 61 transmitting voltage Vpp and the output node and having a gate receiving bank reset signal BRST.

Main decoder 55 further includes an n channel transistor QHN having a gate receiving hierarchical power supply control signal SCRC and connecting the ground voltage Vss line with the interconnection line 62, and a train of transistors 58 serially connected between the output node NOUT and the interconnection line 62.

N channel transistor QHN is a transistor that has a threshold voltage Vvm which is higher than those of transistor QPB1 and transistors which constitute the train of transistors 58.

The train of transistors 58 has n channel transistors QN1 to QNn, which have gates respectively receiving, from row pre-decoder 52, pre-decode signals PM1 to PMn that are associated with the selection of main word line MWL. The respective main decoders are provided with inverted pre-decode signals associated with the selection of the corresponding main word line MWL. In other words, in the main decoder of FIG. 5 corresponding to the main word line MWL #1, transistor QN1 receives /PM1, i.e., an inverted signal of pre-decode signal PM1. Other transistors QN2 to QNn included in the train of transistors 58 receive pre-decode signals PM2 to PMn, as they are, respectively.

With the above-described configuration, transistors included in the train of transistors 58 are all turned ON when the pre-decode signal designating the selection of the corresponding main word line MWL is activated, and thus the output node and interconnection line 62 are connected to each other. At this time, decode signal DMWL is activated (to an "L" level) to drive the corresponding main word line MWL to a selected state.

P channel transistor QPB1 turns ON in response to bank reset signal BRST and connects the output node NOUT with interconnection line 61. Bank reset signal BRST is a signal that is activated (to an "L" level) to cause all the rows to be driven to an unselected state prior to the pre-charge operation. According to the activation of bank reset signal BRST, the voltage of the output node NOUT becomes Vpp, and decode signal DMWL is inactivated (to an "H" level).

The source of transistor QNn being the last stage of the train of transistors 58 is provided with a voltage VN by interconnection line 62.

Figure 6A:
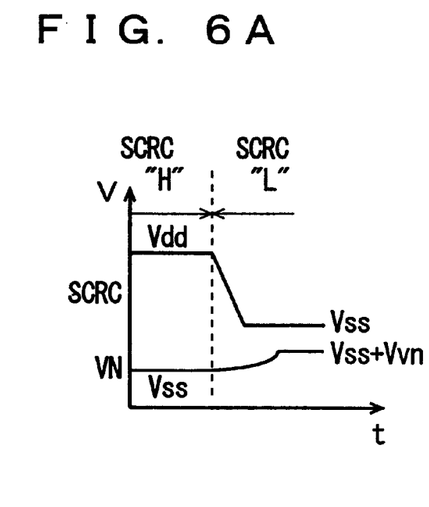
FIG. 6A is a diagram showing a relation between a hierarchical power supply control signal SCRC and a voltage VN.
Figure 6B:
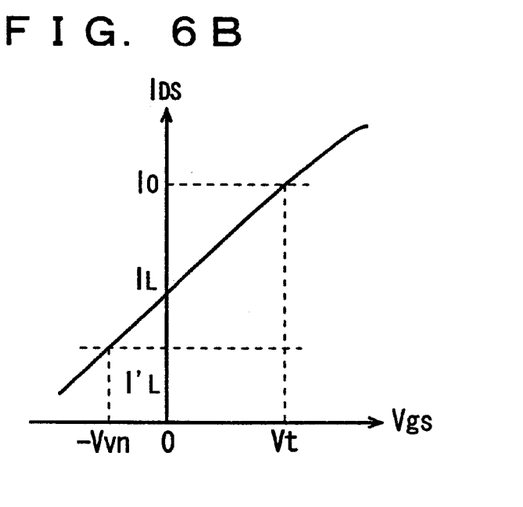
FIG. 6B is a diagram showing changes in a gate-to-source voltage of a transistor QNn dependent on the signal SCRC in the hierarchical power supply structure.

FIG. 6A is a diagram illustrating a relation between hierarchical power supply control signal SCRC and voltage VN. FIG. 6B is a diagram illustrating changes in the gate-to-source voltage of transistor QNn dependent on the hierarchical power supply structure.

Referring to FIG. 6A, during the active period (at "H" level, Vdd) of hierarchical power supply control signal SCRC, transistor QHN is ON, and voltage VN of interconnection line 62 equals Vss. Conversely, when hierarchical power supply control signal SCRC is inactivated (to an "L" level, Vss), transistor QHN is turned OFF, but because of the presence of a minute sub-threshold current, the voltage of interconnection line 62 is raised by Vvn to Vss+Vvn.

Referring now to FIG. 6B, the gate-to-source voltage of transistor QNn will be described. When the row select operation is reset, the pre-decode signal attains an "L" level, and thus Vss is supplied to the gate of transistor QNn. If the hierarchical power supply structure is not used, the source of transistor QNn is provided with ground voltage Vss, and thus the gate-to-source voltage Vgs=0, whereby sub-threshold current IL is produced dependent on threshold voltage Vt of the transistor.

Here, if the hierarchical power supply structure is adopted, the source voltage of transistor QNn is raised from Vss to Vss+Vvn, and transistor QNn is reverse-biased from gate to source, and thus Vgs=−Vvn. With this effect, source/drain current Ids of transistor QHN becomes IL' and the sub-threshold current is reduced from IL to IL'.

That is, when hierarchical power supply control signal SCRC is inactivated (to an "L" level), the sub-threshold current passing through the train of transistors 58 is reduced, and therefore, the entire leakage current of main decoder 55 can be reduced.

Figure 7:
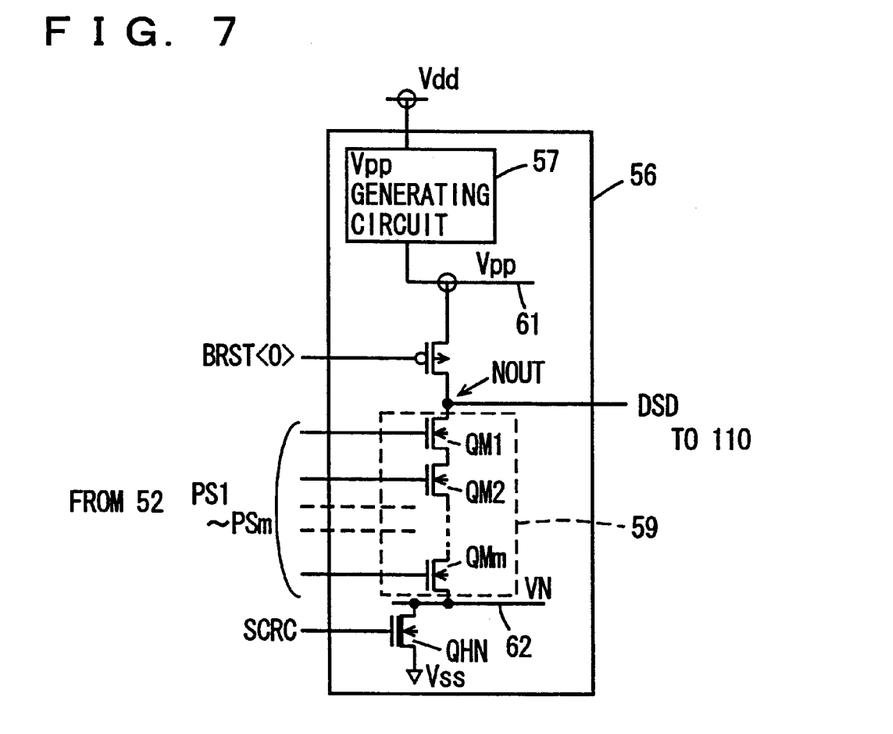
FIG. 7 is a circuit diagram showing a specific configuration of a sub decoder 56 in the row X decoder 54.

FIG. 7 is a circuit diagram showing a specific configuration of a sub decoder 56. In sub decoder 56, the train of transistors 59 connected between the output node and interconnection line 62 is different in configuration from the equivalent in main decoder 55. More specifically, transistors QM1 to QMm included in the train of transistors 59 receive, from row pre-decoder 52, decode signals PS1 to PSm associated with the selection of the sub-decode signal, respectively.

Other circuit configurations and operations of sub decoder 56 are identical to those of main decoder 55, and thus description thereof is not repeated.

Figure 8:
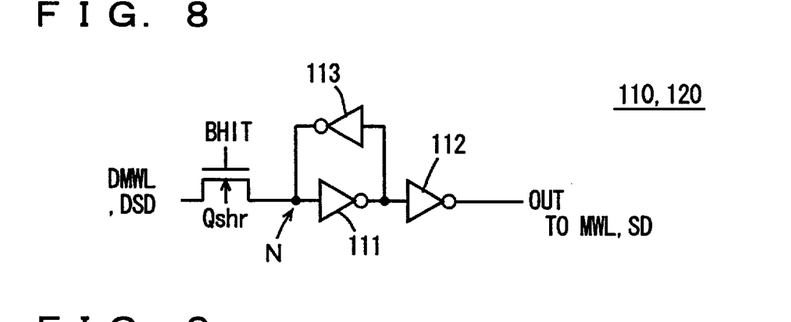
FIG. 8 is a circuit diagram showing a specific configuration of drivers 110 and 120.

FIG. 8 is a block diagram showing a specific configuration of a main word driver 110 and a sub-decode driver 120 (hereinafter, referred to as a "driver").

Referring to FIG. 8, the driver includes an intermediate node N, a transfer transistor Qshr having a gate receiving the bank hit signal and transmitting the decode signal DMWL or DSD to intermediate node N, an inverter 111 inverting intermediate node N for output, an inverter 112 further inverting the output of inverter 111, and an inverter 113 inverting the output of inverter 111 for application to an input of inverter 111.

Bank hit signal BHIT is a signal that is activated (to an "H" level) when the bank is selected according to the selection of the bank or the pre-charge operation. When bank hit signal BHIT is activated, transfer transistor Qshr is turned ON, and decode signal DMWL or DSD is transmitted to intermediate node N. Data transmitted to intermediate node N are latched by inverters 111 and 113 to hold the state of the data transmitted. As bank hit signal BHIT is a one-shot pulse, transfer transistor Qshr is turned OFF again when the data is latched to intermediate node N. Thus, in response to the selection of the bank, the corresponding decode signal is held at the driver. Furthermore, inverters 111 to 113 are composed of transistors having threshold voltages higher than those of other transistors. Therefore, the sub-threshold current generated in the transistors included in the driver itself can be suppressed, which also reduces the leakage current of the driver per se. Accordingly, further reduction of power dissipation of the entire semiconductor memory device can be attained. Moreover, as described above, this data holding capability allows the circuit associated with the row decoding to be reset after a prescribed time period even during the active operation, thus permitting the hierarchical power supply structure to be adopted.

Figure 9:
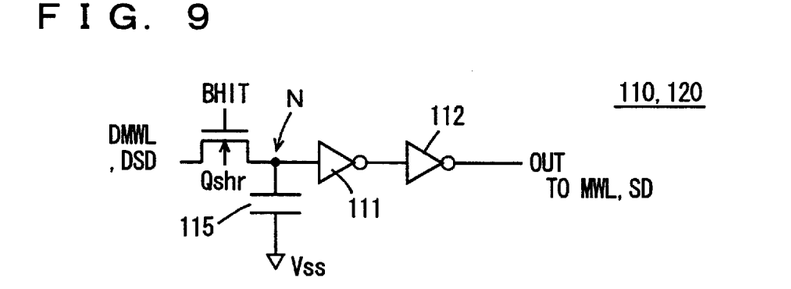
FIG. 9 is a circuit diagram showing another specific configuration of drivers 110 and 120.

FIG. 9 is a circuit diagram showing another example of the specific configuration of the driver.

Referring to FIG. 9, the driver of FIG. 9 is different from that of FIG. 8 in that there is provided, instead of inverter 113, a capacitor 115 connected between intermediate node N and ground voltage Vss. In the driver shown in FIG. 9, the state of intermediate node N is maintained by capacitor 115, and thus the decode signal is held by the driver. Timing for taking in the decode signal, and the holding capability are identical to those for the driver in FIG. 8, and therefore, description thereof is not repeated.

Now, the entire operation of SDRAM 1 will be described.

Figure 10:
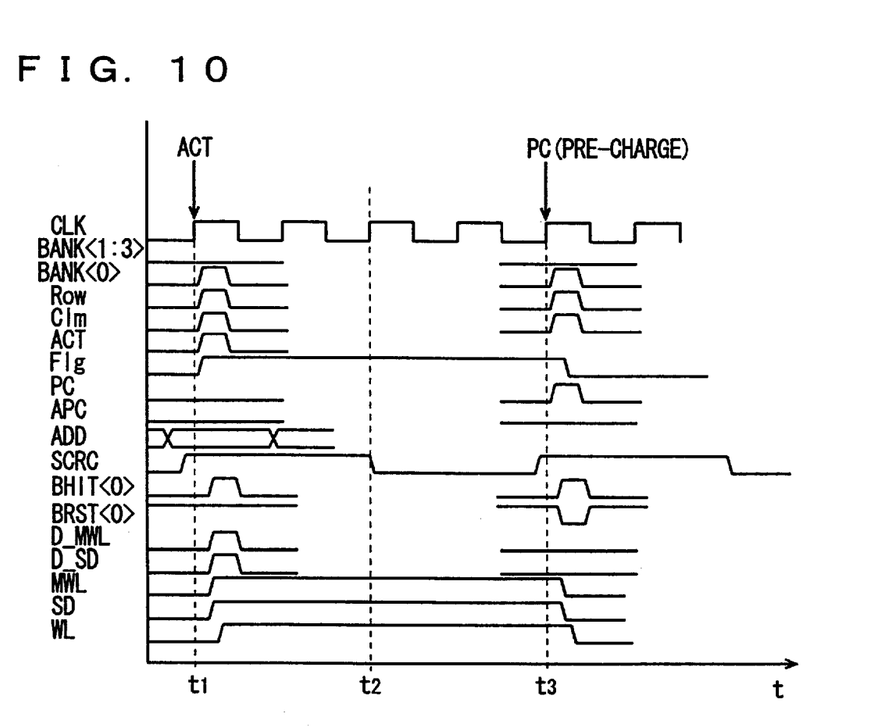
FIG. 10 is a timing chart of respective signals illustrating entire operation of the SDRAM 1.

FIG. 10 is a time chart showing the operating states of respective signals of SDRAM 1.

Referring to FIG. 10, bank #0 is selected and activated at a rising timing of the clock CLK at the time t1. In response, BANK<0> showing the bank address, signals Row, Clm and ACT are activated. The flag signal Flg shown in FIG. 10 is a signal that is held at a certain level in row system control circuit 45a in response to the event that the bank has been accessed.

By the combination of these signals, bank hit signal BHIT<0> is activated by row system control circuit 45a. Hierarchical power supply control signal SCRC is activated (to an "H" level) prior to the activation of the row system operation.

In response to the activation of row system operation as well as of bank hit signal BHIT, the address signal is taken in, pre-decoded and decoded, and then the decode signal is held at the driver. A prescribed operation is performed against a row of memory cells selected corresponding to the held decode signal.

At the time t2 after a sufficient time period has passed for taking in external data for performing read operation (e.g., burst read) of data from the memory cell, control circuit 40 causes hierarchical power supply control signal SCRC to be inactivated (to an "L" level). By this inactivation of hierarchical power supply control signal SCRC, the circuits included in region 200 shown in FIG. 2 enter the state in which operations are reset. This allows the reduction of the sub-threshold current, and thus the suppression of the leakage current.

Further, at a rising edge of clock signal CLK at the time t3, bank #0 is instructed to perform pre-charge operation, and in connection with this, bank address signal BANK<0>, pre-charge signal PC, and signals Row and Clm are activated. By these signals, bank reset signal BRST<0> is activated (to an "L" level), and all the rows in bank #0 are rendered to an unselected state by row X decoder 54. The data are transmitted to and held in the driver by the activation of bank hit signal BHIT<0>. At time t3, hierarchical power supply control signal SCRC is also activated (to an "H" level), and the row select operation is performed, receiving normal operating voltage Vdd and ground voltage Vss.

That is, during the time period from t2 to t3, hierarchical power supply control signal SCRC is inactivated to reduce the sub-threshold current of transistors of the circuits included in region 200 of FIG. 2, and thus, data in row pre-decoder 52, row X decoder 54 and the like are reset. However, since the driver has the data holding capability, the row select operation can be performed normally.

By employing the configuration as described above, in SDRAM 1, the leakage current of the circuits that are included in region 200 and associated with row selection can be reduced not only during stand-by but also when the bank is in an active state. Accordingly, low-power operation of the entire semiconductor memory device can be realized.

Second Embodiment

The second embodiment of the present invention is directed to further utilize the data holding capability of the driver more affirmatively, and to design the circuit for row selecting operation more efficiently, in addition to the low power operation of the semiconductor memory device that has been attained in the first embodiment.

Figure 11:
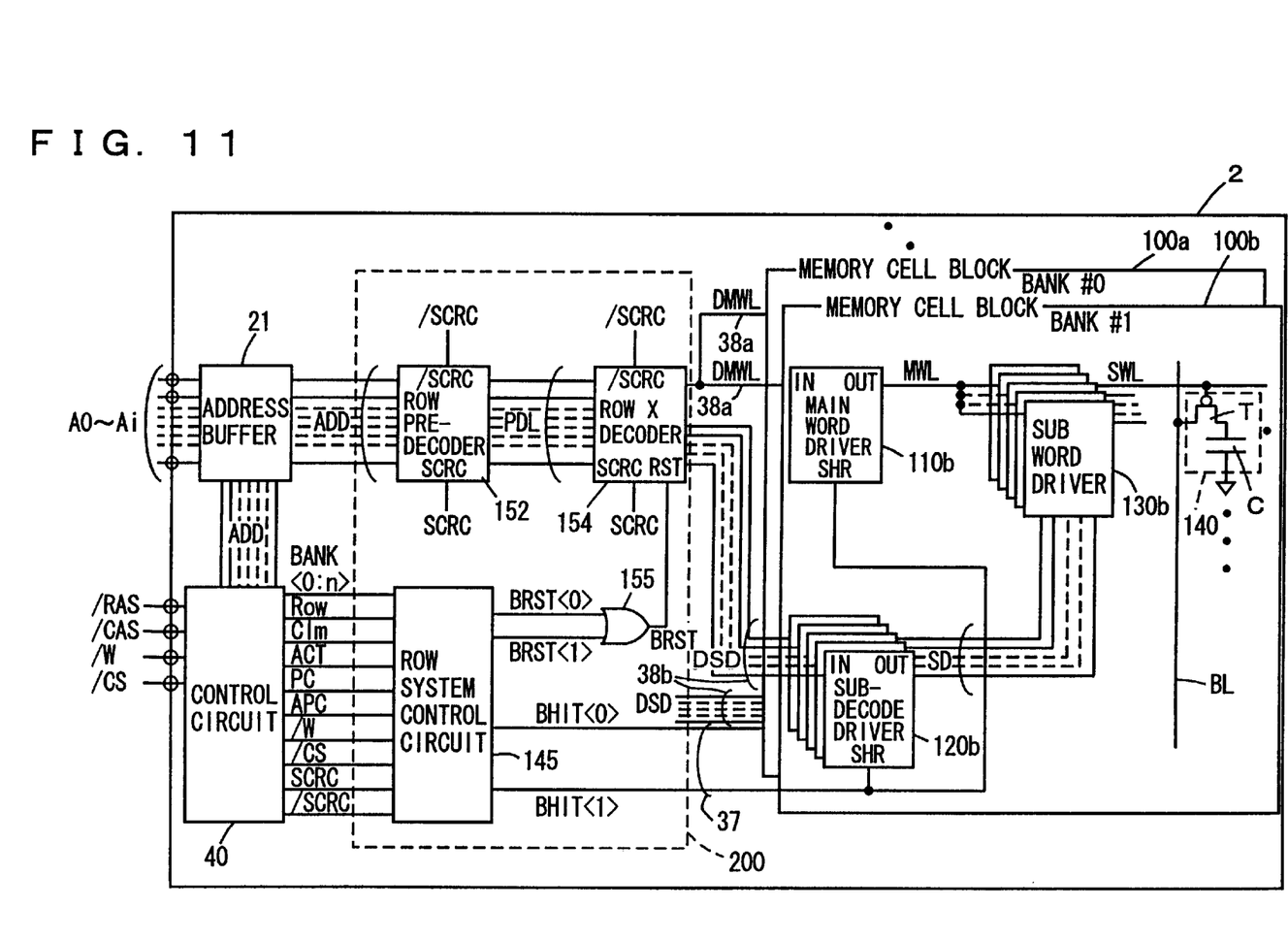
FIG. 11 is a schematic block diagram showing the entire configuration of the circuits associated with the row select operation in the SDRAM 2 according to a second embodiment.

FIG. 11 is a block diagram showing the entire configuration of the SDRAM 2 according to the second embodiment of the present invention.

Referring to FIG. 11, in SDRAM 2, row pre-decoder 152, row X decoder 154 and row system control circuit 145 included in region 200 are shared by a plurality of banks.

FIG. 11 shows, by way of example, the case where these circuits are commonly provided for neighboring banks #0 and #1. That is, row system control circuit 145 generates bank hit signal BHIT and bank reset signal BRST for both banks #0 and #1. Bank hit signals BHIT<0> and BHIT<1> are transmitted over interconnection line 37 to the corresponding banks, respectively.

An operation circuit 155 is further provided in region 200. Operation circuit 155 receives bank reset signals BRST<0> and BRST<1> to output a result of a logical sum operation, and provides its output to row X decoder 154. Consequently, the row X decoder causes all the rows to enter an unselected state when either one of the corresponding banks is instructed to perform pre-charge operation. When the pre-charge operation is not instructed, the row X decoder performs normal decode operation, and generates the decode signal. The decode signal is transmitted to banks #0 and #1 by interconnection lines 38a and 38b, respectively.

Figure 12:
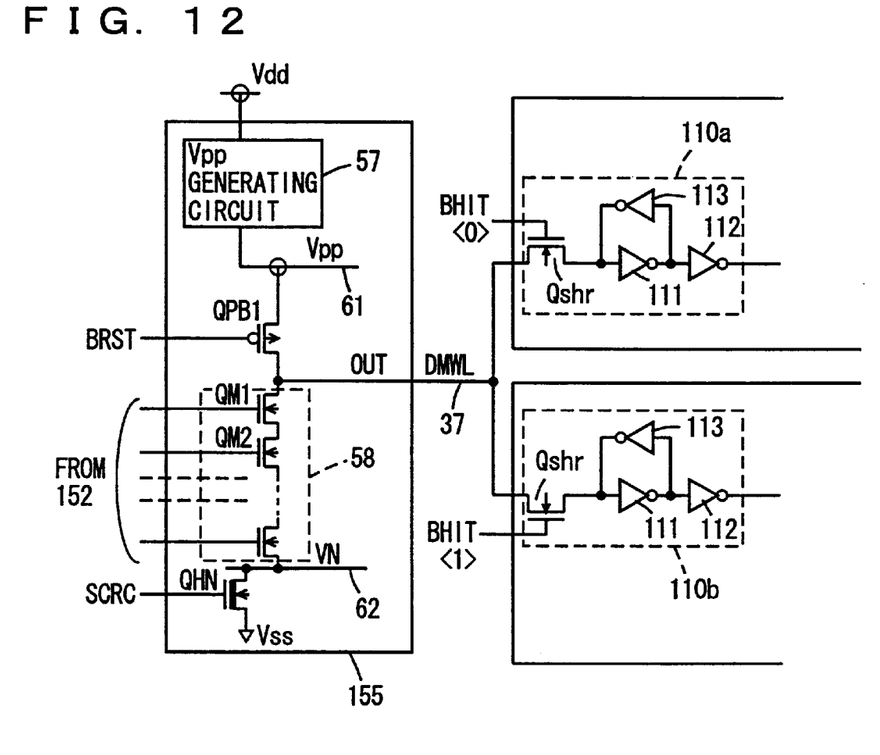
FIG. 12 is a circuit diagram showing connections between a main decoder 155 and a main word driver 110 in the SDRAM 2.

FIG. 12 is a block diagram showing a connection between the row X decoder and the driver in SDRAM 2. Specifically, shown in FIG. 12 are connections between main decoder 155 and main word drivers 110a and 110b in the corresponding, respective banks, for the select operation of main word line MWL.

The configuration and operation of main decoder 155 are identical to those of main decoder 55 described above with reference to FIG. 5. Decode signal DMWL, which is an output of main decoder 155, is applied to main word driver 110a in bank #0 and main word driver 110b in bank #1. Bank hit signal BHIT<0> is applied to the gate of transfer transistor Qshr included in main word driver 110a. Main word driver 110a takes in and holds decode signal DMWL in response to the selection of the bank. Similarly in bank #1, decode signal DMWL is taken in and held by main word driver 110b in response to bank hit signal BHIT<1> indicating that the bank #1 has been selected.

Since respective banks can perform row system operation for the corresponding selected rows based on the once held decode signals, it is unnecessary to maintain the state of the decode signal, or the output of row X decoder, after the decode signal is transferred to the main word driver. Accordingly, the circuits included in region 200 and associated with the row selection can be shared among a plurality of banks.

As explained above, in the circuits included in region 200 and associated with row select operation, not only the low power operation can be attained by adopting the hierarchical power supply structure as described in the first embodiment, but also the number of circuits can be reduced by making them shared among a plurality of banks. This leads to reduction of the parts count as well as area occupied on a chip, and thus layout efficiency can be improved.

It should be understood that, though main word drivers 110a and 110b in FIG. 12 each have circuit configuration as shown in FIG. 8, the circuit configuration as shown in FIG. 9 may of course be applied.

Further, in the embodiments of the present invention, the "L" level of decode signals (DMWL, DSD) has been defined to be an active state, and the specific circuit configuration of the corresponding decode circuit has been shown in FIGS. 7 and 12. However, the contents of the present invention are not limited thereto. That is, it is of course possible to define the active state of the decode signal to be the "H" level, and to design the corresponding decode circuit under the concept similar to those for the configurations shown in FIGS. 7 and 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal and a control signal in synchronization with an external clock signal and sending and receiving storage data, comprising:
    a memory cell array having a plurality of memory cells arranged in rows and columns, and divided into a plurality of memory cell blocks;
    a plurality of word lines provided corresponding to respective rows of said memory cells;
    a control circuit responsive to said address signal and said control signal for selectively instructing at least one of said plurality of memory cell blocks to perform a prescribed operation; and
    a plurality of row select circuits each provided for a corresponding one of said memory cell blocks for selecting at least one of said rows of said memory cell block in response to said address signal, each of said row select circuits including
        a row select signal generating circuit for generating a pulse-wise row select signal according to said address signal,
        a hierarchical power supply circuit, activated in response to the selection of said corresponding memory cell block and supplying voltage power to said row select signal generating circuit at least during an active period of said pulse-wise row select signal, and changing voltage power level to reduce a leakage current through said row select signal generating circuit during a stand-by state,
        a plurality of row select signal lines each for transmitting said pulse-wise row select signal to said corresponding memory cell block, and
        a plurality of row drive circuits each coupled to one of said row select signal lines in response to the selection of said memory cell block for latching a state of said pulse-wise row select signal and driving the potential level of a corresponding one of said word lines.

2. The synchronous semiconductor memory device according to claim 1,
    wherein each of said plurality of memory cell blocks is a bank capable of performing read and write operations independent of one another.

3. The synchronous semiconductor memory device according to claim 2, wherein
    said pulse-wise row select signal has two states; and
    said hierarchical power supply circuit has
        either one of a first voltage switching circuit and a second voltage switching circuit; said first voltage switching circuit receiving a first power supply potential, and providing the first power supply potential in an active state and providing a third power supply potential that is lower than the first power supply potential in said stand-by state; and said second voltage switching circuit receiving a second power supply potential that is lower than the first power supply potential, and providing the second power supply potential in said active state and providing a fourth power supply potential that is higher than the second power supply potential and is lower than the third power supply potential in said stand-by state.

4. The synchronous semiconductor memory device according to claim 2, wherein
    said pulse-wise row select signal has two states; and
    said hierarchical power supply circuit has
        a first voltage switching circuit receiving a first power supply potential and providing the first power supply potential in an active state and providing a third power supply potential that is lower than the first power supply potential in said stand-by state, and
        a second voltage switching circuit receiving a second power supply potential that is lower than the first power supply potential and providing the second power supply potential in said active state and providing a fourth power supply potential that is higher than the second power supply potential and is lower than the third power supply potential in said stand-by state.

5. The synchronous semiconductor memory device according to claim 2, further comprising:
    a first power supply line for providing a first power supply potential that corresponds to either one of said two states of said pulse-wise row select signal; and
    a second power supply line for providing a second power supply potential that is lower than the first power supply potential and corresponds to the other one of said two states of said pulse-wise row select signal;
    said row select circuit further including a secondary control circuit for generating a bank reset signal that is activated to cause all the rows in said bank to be in an unselected state prior to pre-charge operation;
    said hierarchical power supply circuit including
        a third power supply line for providing a voltage to said row select signal generating circuit, and
        a first MOS transistor connecting said third power supply line and said second power supply line in said active state, and blocking the connection of said third power supply line and said second power supply line in said stand-by state; and
    said row select signal generating circuit having
        an output node for outputting said pulse-wise row select signal,
        a logical operation circuit responsive to said address signal for connecting said output node and said third power supply line, and
        a reset circuit responsive to activation of said bank reset signal for connecting said output node and said first power supply line.

6. The synchronous semiconductor memory device according to claim 5, wherein
    said logical operation circuit and said reset circuit each include a MOS transistor having a first threshold voltage; and
    said first MOS transistor has a second threshold voltage that is higher than said first threshold voltage.

7. The synchronous semiconductor memory device according to claim 5, wherein
said secondary control circuit further generates a bank hit signal that is activated for starting row selection according to the selection of said bank;
said row drive circuit includes
a transfer circuit responsive to activation of said bank hit signal for transferring said pulse-wise row select signal,
a first inverter for inverting an output of said transfer circuit,
a second inverter for inverting an output of said first inverter for transmission to said word line, and
a third inverter for inverting an output of said first inverter for application to an input of said first inverter; and
said first, second and third inverters each include a MOS transistor having the second threshold voltage that is higher than the first threshold voltage of the MOS transistor included in said memory cell array.

8. The synchronous semiconductor memory device according to claim 5, wherein
said secondary control circuit further generates a bank hit signal that is activated for starting row selection in response to the selection of said bank;
said row drive circuit includes
a transfer circuit responsive to activation of said bank hit signal for transferring said pulse-wise row select signal,
a first inverter for inverting an output of said transfer circuit, a capacitor connected between an output node of said transfer circuit and said second power supply line, and
a second inverter for inverting an output of said first inverter for transmission to said word line;
said first and second inverters each include a MOS transistor having the second threshold voltage that is higher than the first threshold voltage of the MOS transistor included in said memory cell array.

9. The synchronous semiconductor memory device according to claim 2, wherein
said word lines include
a main word line provided for every first plurality of said rows, and
a sub word line provided for a respective one of said rows;
said pulse-wise row select signal includes
a main row select signal for activating said main word line selectively, and
a sub row select signal for activating said sub word line selectively; and
said row select circuit further includes
a pre-decode circuit provided with a power supply voltage by said hierarchical power supply circuit for receiving said address signal and generating a pre-decode signal,
a main row select signal generating circuit provided with a power supply voltage by said hierarchical power supply circuit for receiving said pre-decode signal and generating said main row select signal, and
a sub row select signal generating circuit provided with a power supply voltage by said hierarchical power supply circuit for receiving said pre-decode signal and generating said sub row select signal.

10. The synchronous semiconductor memory device according to claim 1, wherein
an active period of said hierarchical power supply circuit is longer than a period of time necessary for sending and receiving storage data in said memory cell block.

11. A synchronous semiconductor memory device receiving an address signal and a control signal in synchronization with an external clock signal and sending and receiving storage data, comprising:
a memory cell array having a plurality of memory cells arranged in rows and columns, and divided into a first plurality of memory cell blocks;
a plurality of word lines provided corresponding to respective rows of said memory cells;
a control circuit responsive to said address signal and said control signal for selectively instructing at least one of said plurality of memory cell blocks to perform a prescribed operation; and
a plurality of row select circuits provided for every second plurality of said memory cell blocks, each for selecting at least one of said rows of said memory cell block in response to said address signal, each of said row select circuits including
a row select signal generating circuit for generating a pulse-wise row select signal according to said address signal,
a hierarchical power supply circuit, activated in response to the selection of said memory cell block out of said corresponding second plurality of memory cell blocks and supplying voltage power to said row select signal generating circuit at least during an active period of said pulse-wise row select signal, and changing voltage power level to reduce a leakage current through said row select signal generating circuit during a stand-by state,
a plurality of row select signal lines each for transmitting said pulse-wise row select signal to said corresponding second plurality of memory cell blocks, and
a plurality of row drive circuits each coupled to one of said row select signal lines in response to the selection of said memory cell block for latching a state of said pulse-wise row select signal and driving the potential level of a corresponding one of said word lines.

12. The synchronous semiconductor memory device according to claim 11,
wherein each of said plurality of memory cell blocks is a bank capable of performing read and write operations independent of one another.

13. The synchronous semiconductor memory device according to claim 12, wherein
said pulse-wise row select signal has two states; and
said hierarchical power supply circuit has
either one of a first voltage switching circuit and a second voltage switching circuit; said first voltage switching circuit receiving a first power supply potential, and providing the first power supply potential in an active state and providing a third power supply potential that is lower than the first power supply potential in said stand-by state; and said second voltage switching circuit receiving a second power supply potential that is lower than the first power supply potential, and providing the second power supply potential in said active state and providing a fourth power supply potential that is higher than the second power supply potential and is lower than the third power supply potential in said stand-by state.

14. The synchronous semiconductor memory device according to claim 12, wherein said pulse-wise row select signal has two states; and said hierarchical power supply circuit has a first voltage switching circuit receiving a first power supply potential and providing the first power supply potential in an active state and providing a third power supply potential that is lower than the first power supply potential in said stand-by state, and a second voltage switching circuit receiving a second power supply potential that is lower than the said first power supply potential and providing the second power supply potential in said active state and providing a fourth power supply potential that is higher than the second power supply potential and is lower than the third power supply potential in said stand-by state.

15. The synchronous semiconductor memory device according to claim 12, further comprising:

a first power supply line for providing a first power supply potential that corresponds to either one of said two states of said pulse-wise row select signal; and a second power supply line for providing a second power supply potential that is lower than the first power supply potential and corresponds to the other one of said two states of said pulse-wise row select signal;

said row select circuit further including a secondary control circuit for generating a bank reset signal that is activated to cause all the rows in said bank to be in an unselected state prior to pre-charge operation;

said hierarchical power supply circuit including a third power supply line for providing a voltage to said row select signal generating circuit, and a first MOS transistor connecting said third power supply line and said second power supply line in said active state, and blocking the connection of said third power supply line and said second power supply line in said stand-by state; and said row select signal generating circuit having an output node for outputting said pulse-wise row select signal, a logical operation circuit responsive to said address signal for connecting said output node and said third power supply line, and a reset circuit responsive to activation of said bank reset signal for connecting said output node and said first power supply line.

16. The synchronous semiconductor memory device according to claim 15, wherein said logical operation circuit and said reset circuit each include a MOS transistor having a first threshold voltage; and said first MOS transistor has a second threshold voltage that is higher than said first threshold voltage.

17. The synchronous semiconductor memory device according to claim 15, wherein said secondary control circuit further generates a bank hit signal that is activated for starting row selection according to the selection of said bank;

said row drive circuit includes a transfer circuit responsive to activation of said bank hit signal for transferring said pulse-wise row select signal, a first inverter for inverting an output of said transfer circuit, a second inverter for inverting an output of said first inverter for transmission to said word line, and a third inverter for inverting an output of said first inverter for application to an input of said first inverter; and said first, second and third inverters each include a MOS transistor having the second threshold voltage that is higher than the first threshold voltage of the MOS transistor included in said memory cell array.

18. The synchronous semiconductor memory device according to claim 15, wherein said secondary control circuit further generates a bank hit signal that is activated for starting row selection in response to the selection of said bank;

said row drive circuit includes a transfer circuit responsive to activation of said bank hit signal for transferring said pulse-wise row select signal, a first inverter for inverting an output of said transfer circuit, a capacitor connected between an output node of said transfer circuit and said second power supply line, and a second inverter for inverting an output of said first inverter for transmission to said word line;

said first and second inverters each include a MOS transistor having the second threshold voltage that is higher than the first threshold voltage of the MOS transistor included in said memory cell array.

19. The synchronous semiconductor memory device according to claim 12, wherein said word lines include a main word line provided for every first plurality of said rows, and a sub word line provided for a respective one of said rows;

said pulse-wise row select signal includes a main row select signal for activating said main word line selectively, and a sub row select signal for activating said sub word line selectively; and said row select circuit further includes a pre-decode circuit provided with a power supply voltage by said hierarchical power supply circuit for receiving said address signal and generating a pre-decode signal, a main row select signal generating circuit provided with a power supply voltage by said hierarchical power supply circuit for receiving said pre-decode signal and generating said main row select signal, and a sub row select signal generating circuit provided with a power supply voltage by said hierarchical power supply circuit for receiving said pre-decode signal and generating said sub row select signal.

20. The synchronous semiconductor memory device according to claim 11, wherein an active period of said hierarchical power supply circuit is longer than a period of time necessary for sending and receiving storage data in said memory cell block.

* * * * *